United States Patent
Sato

[11] Patent Number: 6,020,245
[45] Date of Patent: Feb. 1, 2000

[54] METHOD OF MANUFACTURING SEMICONDUCTOR DEVICE WHERE CHARACTERISTICS CAN BE MEASURED AT MANUFACTURE

[75] Inventor: Fumihiko Sato, Tokyo, Japan

[73] Assignee: NEC Corporation, Tokyo, Japan

[21] Appl. No.: 08/967,758

[22] Filed: Nov. 10, 1997

[30] Foreign Application Priority Data

Nov. 11, 1996 [JP] Japan .................................... 8-298682

[51] Int. Cl.⁷ .................................................. H01L 21/331
[52] U.S. Cl. ............................................. 438/309; 438/14
[58] Field of Search ................................ 438/14, 17, 18, 438/309, 351

[56] References Cited

U.S. PATENT DOCUMENTS

| | | | |
|---|---|---|---|
| 3,134,077 | 5/1964 | Hutchins IV et al. ..................... | 438/17 |
| 4,283,733 | 8/1981 | Aomura . | |
| 5,185,276 | 2/1993 | Chen et al. ............................. | 438/309 |
| 5,296,391 | 3/1994 | Sato et al. . | |
| 5,776,813 | 7/1998 | Huang et al. .......................... | 438/309 |

FOREIGN PATENT DOCUMENTS

| | | |
|---|---|---|
| 077 921 | 6/1983 | European Pat. Off. . |
| 0 312 048 | 4/1989 | European Pat. Off. . |

OTHER PUBLICATIONS

M. Sugiyama et al., "A 40GHz $f_T$ Si Bipolar Transistor LSI Technology", Proceedings of the International Electron Devices Meeting, Washington, Dec. 3–6, 1989, *Institute of Electrical and Electronics Engineers*, No. 3, Dec. 1989, pp. 221–224.

*Patent Abstracts of Japan*, vol. 012, No. 221 (E–625), Jun. 23, 1998.

David J. Roulston, *Bipolar Semiconductor Devices*, "Advanced Technology Devices", McGraw–Hill, Singapore, 1990 p. 342–345.

F. Sato et al., "A 'Self–Aligned' Selective MBE Technology For High–Performance Bipolar Transistors," IEDM Technical Digest, San Francisco, California, Dec. 9–12, 1990, pp. 607–610.

*Primary Examiner*—Tuan H. Nguyen
*Attorney, Agent, or Firm*—Sughrue, Mion, Zinn, Macpeak & Seas, PLLC

[57] ABSTRACT

The present invention realizes a manufacturing method of bipolar transistors allowing omission of photolithographic process of the emitter electrode polysilicon and measurement of the characteristics of the transistor before forming metal electrodes. The present invention discloses a diffusion check transistor within a wafer for mass producing the bipolar transistor having the same structure and the same electrical characteristics. The diffusion check transistor has a collector probe opening of a size which allows a probe needle to contact the collector electrode in the insulated region for measurement, emitter opening of a size which allows the probe to contact emitter electrode positioned in the region which adjoins the preceding region beyond the insulation wall, a trench to bridge between emitter opening and emitter region, burying emitter electrode polysilicon in the trench to connect them electrically, and base opening the size of the opening in an adjoining region, so that the diffusion transistor allows measurement of the diffusivity of the transistor before forming the metal electrodes.

5 Claims, 15 Drawing Sheets

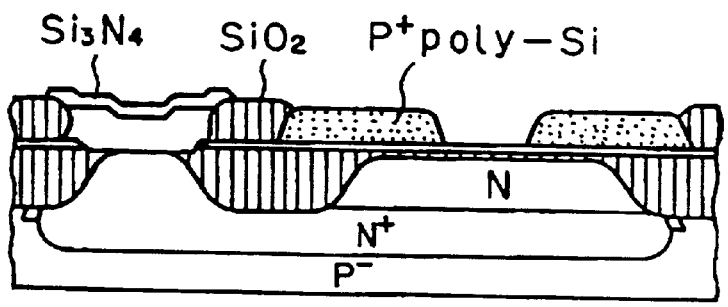
Fig. 1 (a) PRIOR ART
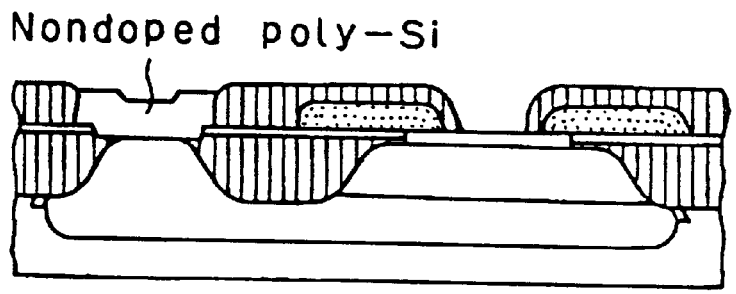
Fig. 1 (b) PRIOR ART
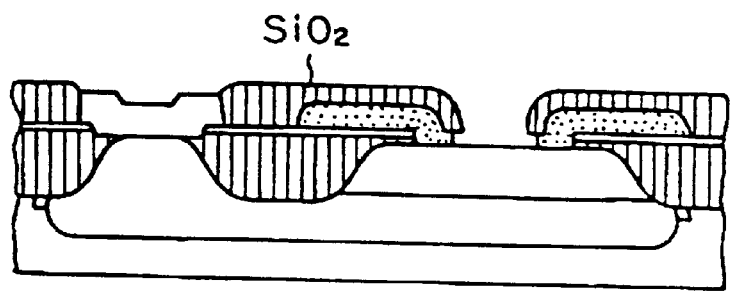
Fig. 1 (c) PRIOR ART
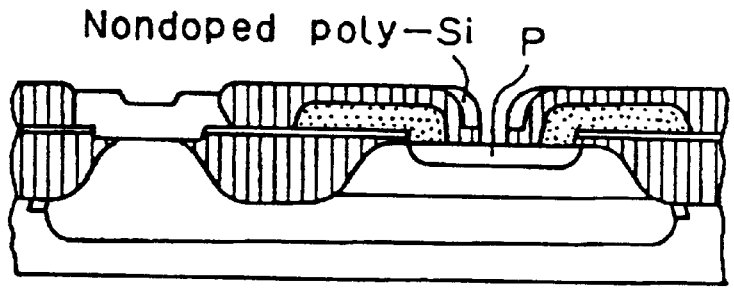
Fig. 1 (d) PRIOR ART
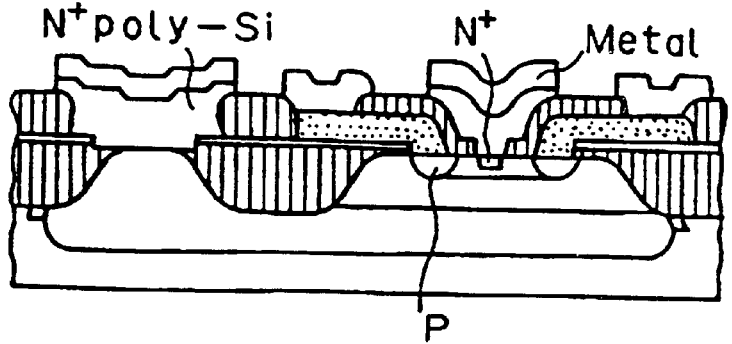
Fig. 1 (e) PRIOR ART

METHOD OF MANUFACTURING SEMICONDUCTOR DEVICE WHERE CHARACTERISTICS CAN BE MEASURED AT MANUFACTURE

BACKGROUND OF THE INVENTION

1. Field of the Invention

The present invention relates to a semiconductor device and a method of manufacturing the same, particularly to a structure and a manufacturing method of a bipolar transistor.

2. Description of the Related Arts

FIG. 1 shows a conventional transistor in which an emitter region is formed by diffusing impurities from polysilicon. This silicon bipolar transistor of a polysilicon emitter structure has an advantage of increasing current amplification factor thus occupying the mainstream of the present transistor market.

Now a conventional semiconductor device and a method of manufacturing the same will be described with reference to the attached drawings.

Also, we refer to the material (David J. Roulston, "Bipolar Semiconductor Devices", McGraw-Hill, page 343–345, 1990).

FIG. 1(a) shows a section of an example of a first conventional semiconductor device. FIGS. 1(b)–(e) show sectional views of a process of making a transistor serially in accordance with a manufacturing method called Super Self-aligned process Technology (SST) developed by Sakai et. al. of NTT Corp. In this process, in order, an emitter opening is formed, no-additive polysilicon is deposited all over a wafer, arsenic is added to polysilicon by an ion implantation method, N+ type polysilicon is provided, remaining in the region within a fixed distance from the emitter opening, being processed by means of photolithography and dry etching. Furthermore, heat-treatment is applied to diffuse arsenic from polysilicon to single crystal silicon, thereby finally producing an emitter.

A second conventional technique will be described with reference to a bipolar transistor of which an intrinsic base layer is formed by an epitaxial growth method.

Then, a second conventional semiconductor device and a method of manufacturing the same will be described referring to the material: Sato, et. al., "A self-aligned selective MBE technology for high performance bipolar transistor", International Electron Device Meeting (IEDM), 1990, pp.607–610.

FIG. 2 shows a section of an example of a second conventional semiconductor device. On P⁻ type silicon substrate 1, there is formed N⁺ type buried layer 2, and further on which N⁻ type silicon epitaxial layer 3 is provided having LOCOS oxide film 14 for device separation and N⁺ type collector draw out region 15 formed therein. Through the above process, a silicon base 100 is composed. Subsequently, the surface of silicon base 100 is covered with silicon oxide film 6. In silicon oxide film 6, there is provided a first opening 101 for preparing a base by exposing a part of silicon collector layer 3 which constitutes a collector region and a second opening 102 for exposing collector draw out region 15.

On silicon oxide film 6, P⁺ type base electrode polysilicon film 7 is selectively formed, being horizontally pushed out into first opening 101 from an edge of the opening. P type polysilicon layer 10 is formed from the under surface of this pushed out portion toward silicon collector layer 3 which constitutes the collector region.

Meanwhile, on the exposed portion of silicon collector layer 3, P type base region 9 is formed with single crystal silicon produced through a selective epitaxial growth process. This polysilicon layer 10 and P type base region 9 contact with each other.

In second opening 102, N type polysilicon layer 21 is formed contacting with collector draw out region 15. P type base region 9 with the exception of an emitter forming portion, polysilicon layers 7 and 10, are covered with silicon nitride film 8 and silicon oxide film 11, respectively. On the exposed part of P type base region 9, N type emitter region 16 is formed with single crystal silicon. Aluminum based emitter electrode 18b, base electrode 18a and collector electrode 18c contact emitter polysilicon 17, polysilicon layer 7 and polysilicon layer 8, respectively.

This second conventional technique is the same as the first conventional technique in that emitter polysilicon is processed by the photolithographic process and the etching process.

With the first and the second conventional semiconductor devices (wherein emitter polysilicon is processed by patterning) and the method of manufacturing thereof, N⁺ type polysilicon is deposited all over the silicon substrate as an emitter electrode, then photoresist is applied on the polysilicon layer and polysilicon patterning is performed through dry etching, thereby producing, as a result, a level difference of the thickness of emitter polysilicon layer directly above the emitter layer.

However, when a minute dimension is processed in the above case through patterning in the photolithographic process, it is more difficult compared to the case with a flat surface because of unevenness of the surface. In other words, for processing a minute dimension, although the light of a short wavelength is advantageous, at the same time it has a disadvantage of narrow margin of focus, and hence the more the unevenness of the surface increases, the more it becomes unsuitable for the case with the minute dimension.

Thus, as a method with which a level difference directly above the emitter portion is controlled to a small value, there is a method to take a structure in which emitter polysilicon exists only in the emitter opening (hereinafter this structure is called a plug structure). This method can be realized in two ways.

In the first method for forming the plug structure, the emitter polysilicon is deposited and then etched back by a dry etching method. Since this method maintains a photolithographic process for patterning emitter polysilicon, it is effective economically. However, according to this method, since polysilicon deposited on a large opening is completely removed by etching back operation, it can not check the characteristics of the emitter polysilicon.

There is a second method for forming the plug structure in which polysilicon is deposited by a selective crystal growth method and then adding arsenic to the deposited polysilicon by means of the ion implantation method to form emitter polysilicon layer. With this forming method, since polysilicon is formed only in the opening on the intrinsic base, the level difference as above is not produced in the emitter polysilicon layer. However, with this method, the emitter dimension of a transistor, as a product to be used in a circuit, is on the level of several μm, whereas the emitter dimension of the diffusion check transistor which is used in the manufacturing stage for checking characteristics is required to be approximately 100 μm square, and characteristics of both transistors do not always coincide with each other. The reason is that when the emitter dimension becomes large, in the inside of the minute opening, arsenic to be supplied by ion implantation is not sufficiently added to the bottom part of polysilicon, resulting in that the diffusion state of emitter impurities (here: arsenic) varies depending upon the size of the opening.

Current high performance bipolar transistors have a base junction depth $X_{JB}$ and an emitter junction depth $X_{JE}$ which are made very shallow for realizing high speed characteristics of the transistor. For example, according to IEEE International Electron Devices Meeting (IEDM), 1989, pp.221–224, the base depth is reported as 0.09 $\mu$m. As a normal method for forming the emitter, the emitter region is formed by making N type impurities such as arsenic or phosphorus diffuse from the surface of the emitter polysilicon into the single crystal base region by applying heat-treatment to the emitter polysilicon (hereinafter called as "emitter push in"). This diffusion is largely influenced by the condition of the interface between the single crystal base and the emitter polysilicon. In other words, prior to deposition of polysilicon, a natural oxide film of approximately 10 angstrom in thickness resides on the surface of the single crystal base. This natural oxide film has dispersed thickness per wafer and poor thickness uniformity in the same wafer. Therefore, the emitter push in process is applied, such that, a piece of transistor is processed by emitter push in operation as a trial and its characteristics are measured (hereinafter a transistor to be measured is called "diffusion check transistor"), and according to the measurement result, the remaining wafers in the same lot are processed by the emitter push in operation.

However, if a emitter is formed in the region of a size in which probing can be made (for example, 80 $\mu m^2$ or more) according to the above described conventional method for selectively forming emitter polysilicon, measurement can be made in that region for monitoring the emitter push in state. But, the emitter dimension of transistors which are actually used as products in the circuit is 1 $\mu$m or less, whereas the emitter dimension of the transistor to be monitored is several tens $\mu$m, and hence diffusion states of emitter impurities are different from each other. Therefore, it is difficult to estimate data of the transistor which is used in the actual circuit by measuring the diffusion check transistor. The reason for the difference in characteristics of both transistors is unknown, but it is thought that the diffusion depth becomes different because of the different occurrence state of the stress which may be caused by the difference between the thermal expansion coefficients of the insulation film surrounding emitter polysilicon (for example, silicon nitride film or silicon oxide film) and polysilicon.

Accordingly, it is necessary to check the diffusion condition of the transistor which has an emitter of the same size as that of the transistor to be used in the circuit. However, in this case, another problem occurs as follows.

That is, it is impossible to measure transistor characteristics on the way of a process flow.

The reason of that is, with a transistor for the conventional structure, without applying patterning to emitter polysilicon according to a combination of a photolithographic process and a dry etching method, it is impossible to form an electrode pad of a dimension which can be probed (for example, 100 $\mu m^2$ or more) from the emitter of the transistor having a minute (a dimension of about 1 $\mu$m) emitter.

SUMMARY OF THE INVENTION

An object of the present invention is to provide an improved transistor having a structure which allows measurement of the characteristics of the transistors at manufacturing, specifically at a stage immediately after the emitter push process. The transistors are bipolar transistors having a structure whose emitter polysilicon is buried in a form of a plug inside the emitter of a minute dimension.

According to the present invention, a trench of a size similar to the dimension of the emitter is formed in the insulation film, extending conductivity of emitter to the outside by burying the trench with polysilicon, and this extended portion is connected to N type single crystal silicon region of a large size which is electrically separated from a collector, thereby a diffusion check transistor is formed without using a photolithographic process.

Since this method can omit the photolithographic process for processing emitter polysilicon, low process cost is realized and flatness of the upper surface of the emitter is improved, thereby promoting the miniaturizing of the wiring in the semiconductor.

BRIEF DESCRIPTION OF THE DRAWINGS

FIG. 1(a) to FIG. 1(e) are longitudinal sections which show a manufacturing process of the semiconductor device according to a first conventional technique.

DESCRIPTION OF THE PREFERRED EMBODIMENT

A first embodiment of the present invention will be described with reference to the drawings.

In the present embodiment, although it is described with reference to an npn type bipolar transistor, it goes without saying that the present invention can also be applied to a pnp type bipolar transistor.

Figure 2:
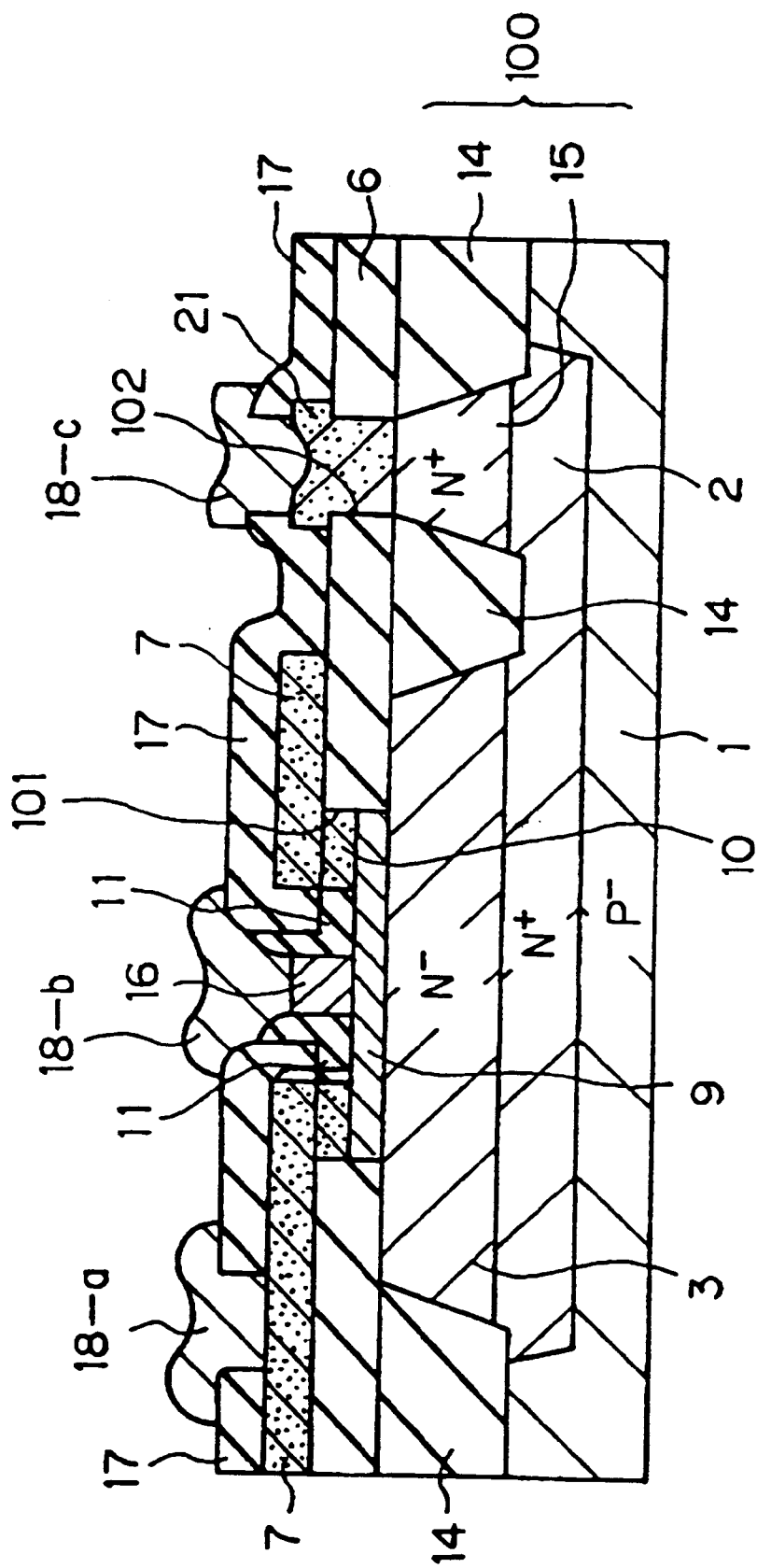
FIG. 2 is a section of the semiconductor device according to a second conventional technique.
Figure 3:
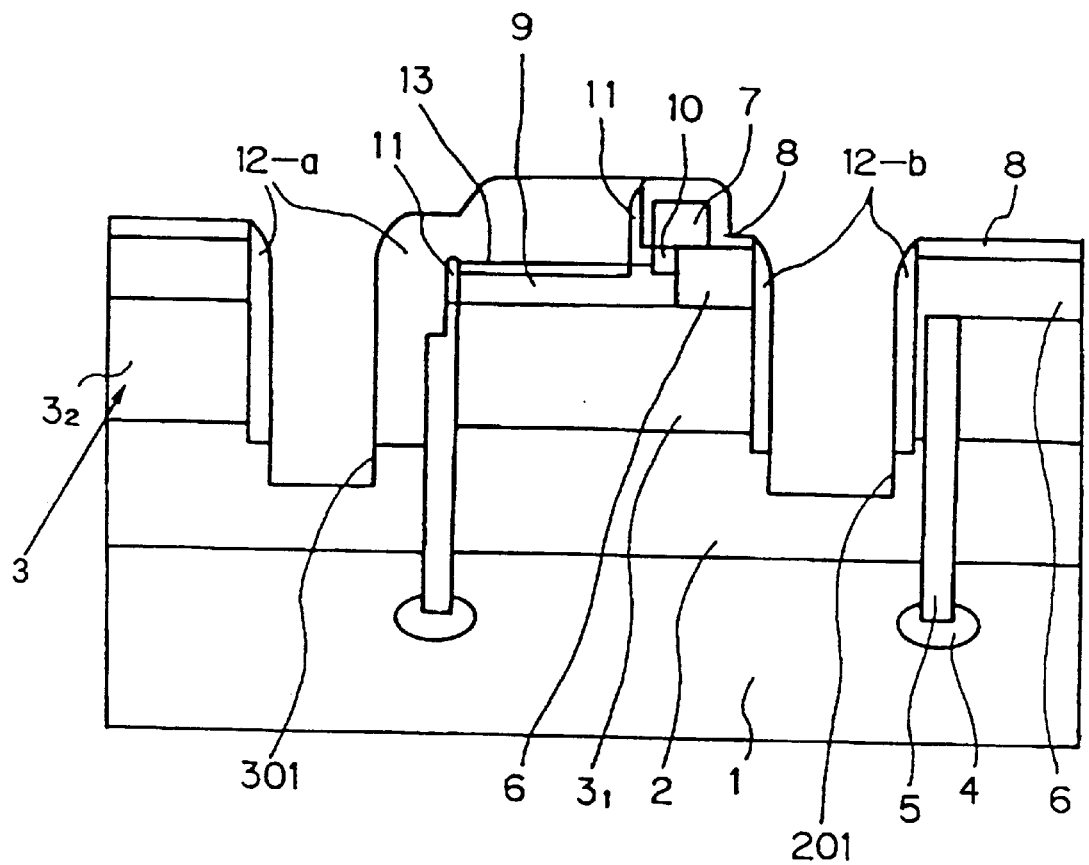
FIG. 3(a) is a longitudinal section of a first embodiment of a diffusion check transistor for measurement use which is employed in a semiconductor device manufacturing method of the present invention.
FIG. 3(b) is a plan thereof.
Figure 3:
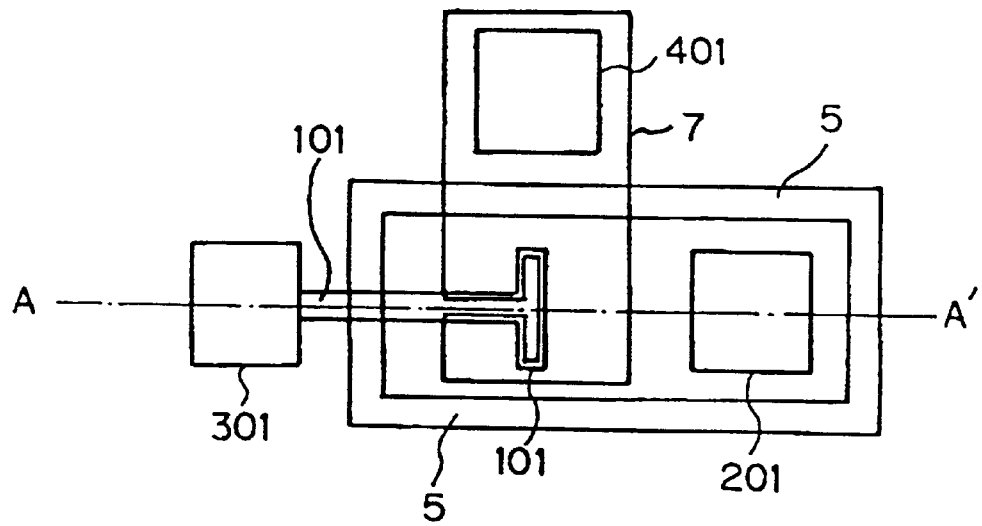

FIG. 3(a) shows a longitudinal section of the first embodiment of a diffusion check transistor which is used in manufacturing a semiconductor device of the present invention, and FIG. 3(b) is a plan thereof. In other words, they are the longitudinal section and the plan of the diffusion check transistor for monitoring emitter push-in operation.

Figure 4:
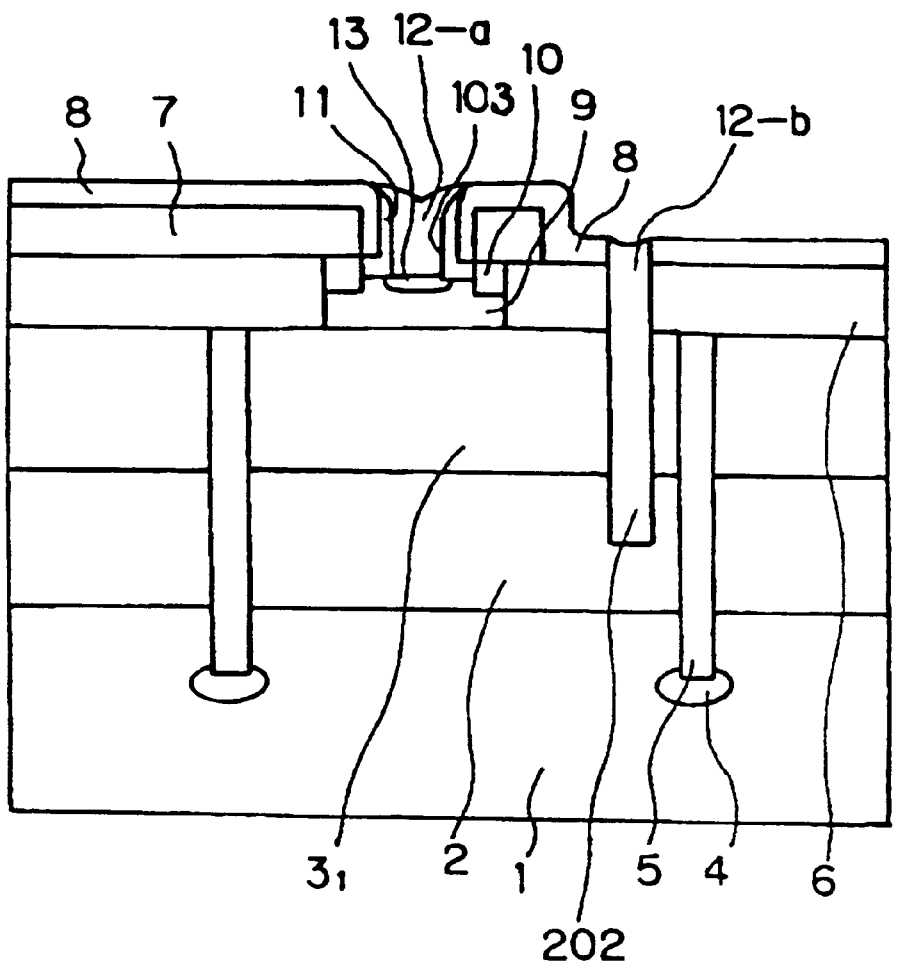
FIG. 4(a) is a longitudinal section of the first embodiment of a semiconductor device according to the present invention to be used within an actual circuit.
FIG. 4(b) is a plan thereof.
Figure 4:
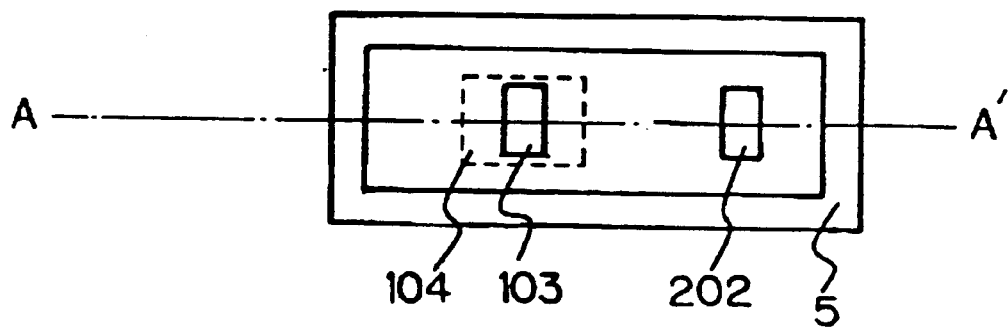

FIG. 4(a) is a longitudinal section of a transistor to be used in a circuit as a product having an emitter of a minute dimension, and FIG. 4(b) is a plan thereof.

In FIG. 3(a), on P$^-$ type silicon substrate 1 having resistivity of 10 to 15 Ωcm, N$^+$ type buried layer 2 and further thereon N$^-$ type silicon epitaxial layer 3, which is denoted as silicon collector layers $3_1$ and $3_2$ are formed. Insulation laying trench 5 for device separation is then formed having P$^+$ type buried layer 4 for channel stopper use formed beneath thereof.

The surface of N$^-$ type silicon epitaxial layer 3 is covered with silicon oxide film 6.

In silicon oxide film 6, there are formed an opening 101 for forming a base by exposing a part of silicon collector layer $3_1$ which constitutes a collector region and an opening 201 which reaches buried layer 2 for forming a collector drawer (hereinafter called a collector opening). In this figure, a lateral dimension of collector opening 201 is made sufficiently large enough to allow a to probe for monitoring (for example, 100 μm square).

P$^+$ type base electrode polysilicon film 7 is selectively formed on silicon oxide film 6 and the silicon collector layer which constitutes the collector region inside opening 101.

On the other hand, on the exposed portion of silicon collector layer $3_1$, P type single crystal silicon intrinsic base region 9 is formed covering N type single crystal silicon which resides inside opening 101, and P$^+$ type polysilicon layer 10 is formed under the bottom surface of P$^+$ type base electrode polysilicon 7, where intrinsic base region 9 and P$^+$ type polysilicon layer 10 contact with each other.

N$^+$ type polysilicon layer 12-b is formed on the sides of collector opening 201.

Emitter electrode N$^+$ polysilicon 12-a resides on the sides of emitter probe opening 301 (of a size about 100 μm square, allowing direct probing) and covers outside trench 5 in another silicon collector layer $3_2$ adjacent to silicon collector layer $3_1$ and intrinsic base 9.

In FIG. 3(b), there is further provided another base probe opening 401 (which has a size of about 100 μm square allowing direct probing).

Next, a primary process of the first embodiment of the present invention will be described with reference to the drawings.

Through silicon oxide film of several hundreds angstrom thick (not shown), ion implantation of arsenic is applied on P$^-$ type (100) orientation silicon substrate 1 having resistivity of 10 to 15 Ωcm. As implantation conditions, for example, energy 50 KeV to 120 KeV, dose 5E15 to 2E16 cm$^{-2}$ are considered appropriate. Subsequently, silicon substrate 1 is heat-treated at temperatures of 1000° C. to 1150° C. for recovery of damages at the time of implantation, activation of arsenic, and effectuation of push in operation. In this way, N$^+$ buried layer 2 is formed.

Then, after finishing removal of all silicon oxide film, N$^-$ type silicon epitaxial layer 3 is formed by a normal forming method. In this case, appropriate growth temperatures are 950° C. to 1050° C., and SiH$_4$ or SiH$_2$Cl$_2$ is used as material gas. PH$_3$ is used as doping gas, and dope of 0.8 μm to 1.3 μm in thickness including impurities of 5E15 to 2E16 cm$^{-3}$ is appropriate. In this way, N$^-$ type silicon epitaxial layer 3 is formed on the buried layer.

Succeedingly, trench 5 and P$^+$ channel stopper 4 are formed for the purpose of device separation. First, a thermal oxide film of 20 nm to 50 nm thick (not shown) is formed on the surface of N$^-$ type silicon epitaxial layer 3, then silicon nitride film (not shown) is formed in thickness of 70 nm to 150 nm; further a silicon oxide film 400 nm thick (not shown) is formed. Subsequently, patterning of a photoresist (not shown) is applied through photolithography, and then a part of a three layer structure consisting of a silicon oxide film, a silicon nitride film, and a silicon oxide film is removed by dry etching. After removing the photoresist, a groove for trench separation which reaches silicon substrate 1 is formed by using the uppermost silicon oxide film as a masking material.

Then, by ion implantation of boron with energy 100 KeV, dose 1E13 cm$^{-2}$ and activation heat-treatment, buried layer 4 for channel stopper use is formed, following which, insulation (such as polysilicon or silicon oxide film) is deposited as a filler in the inside of the trench. Here, description will be made using BPSG as material to be deposited. After depositing BPSG (not shown) in a thickness of about twice the width of the trench (for example, 0.8 μm to 1.5 μm, here it will be described for width 1 μm), heat-treatment (for example, 1000° C., 1 hour) is applied to flatten the surface.

Then, following etching back of the insulation film, removal of silicon nitride film by heated phosphoric acid, and removal of silicon oxide film by HF base liquid, the surface of silicon collector layer $3_1$ is exposed. Conditions of this etching back operation is selected so that the final surface subjected to etching back operation becomes flat.

Then, the surface of silicon collector layer $3_1$ is covered with silicon oxide film 6. The preferable film thickness is 50 nm to 200 nm, here it is 100 nm.

Subsequently, polysilicon is deposited. As thickness of polysilicon to be deposited, 200 nm to 350 nm is appropriate, and here it is 250 nm. Since this polysilicon may be used as base electrode polysilicon, boron is supplied by means of the ion implantation method (for example, 30 KeV, 5E15 to 2E16 $cm^{-2}$) and heat-treatment is performed for activation.

Then, after finishing patterning of the photoresist, unnecessary polysilicon is removed by dry etching, thus producing $P^+$ type base electrode polysilicon 7.

Then, silicon nitride film 8 of about 150 nm thick is deposited by an LPCVD method (thickness of silicon nitride film is appropriately 100 nm to 200 nm).

Figure 5:
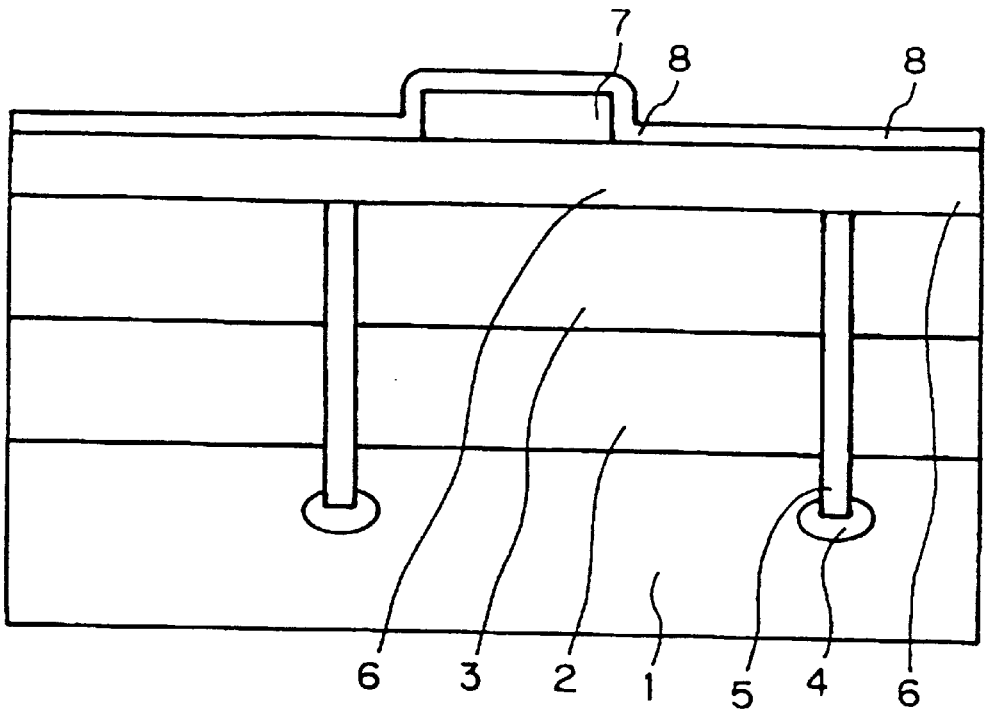
FIG. 5(a) is a longitudinal section of a primary process for manufacturing the diffusion check transistor of the first embodiment and shows the result of the process until base electrode polysilicon 7 and silicon nitride film 8 are formed, and 5(b) is a longitudinal section of the same having miniaturized size for use in a circuit.
Figure 5:
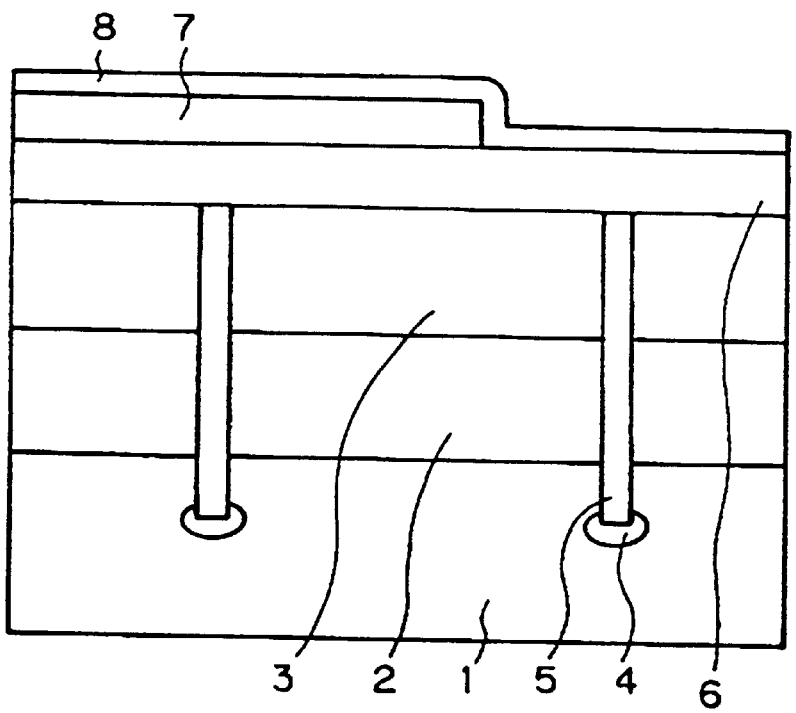

FIGS. 5(a) and 5(b) are illustrated to a similar size, but their actual lateral dimensions are quite different, that is, a distance between trenches is about 100 $\mu$m in FIG. 5(a), but it is as small as about 10 $\mu$m in FIG. 5(b).

This situation is expressed in FIG. 5(a) (a diffusion check transistor for characteristic check) and in FIG. 5(b) (a minute dimension transistor to be processed into a product to be used in a circuit).

Figure 6:
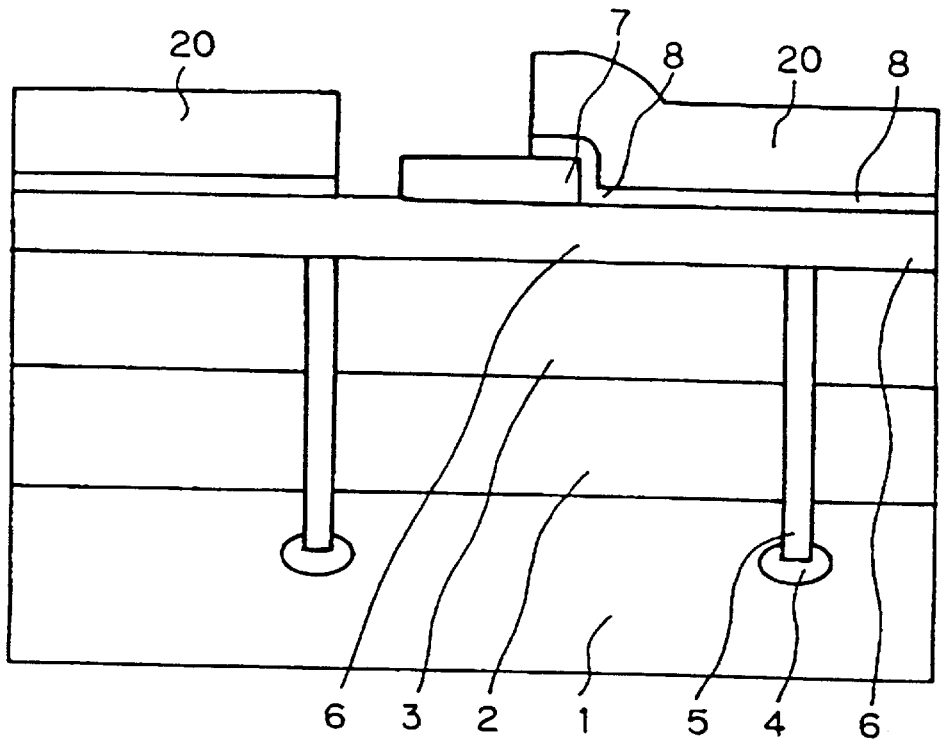
FIG. 6(a) is a longitudinal section of the diffusion check transistor shown in FIG. 3 in a process in which a photoresist is processed by patterning, opening 101 is prepared and an unnecessary part of silicon nitride film 8 is removed.
FIG. 6(b) is a longitudinal section of the same having miniaturized size for use in an actual circuit.
Figure 6:
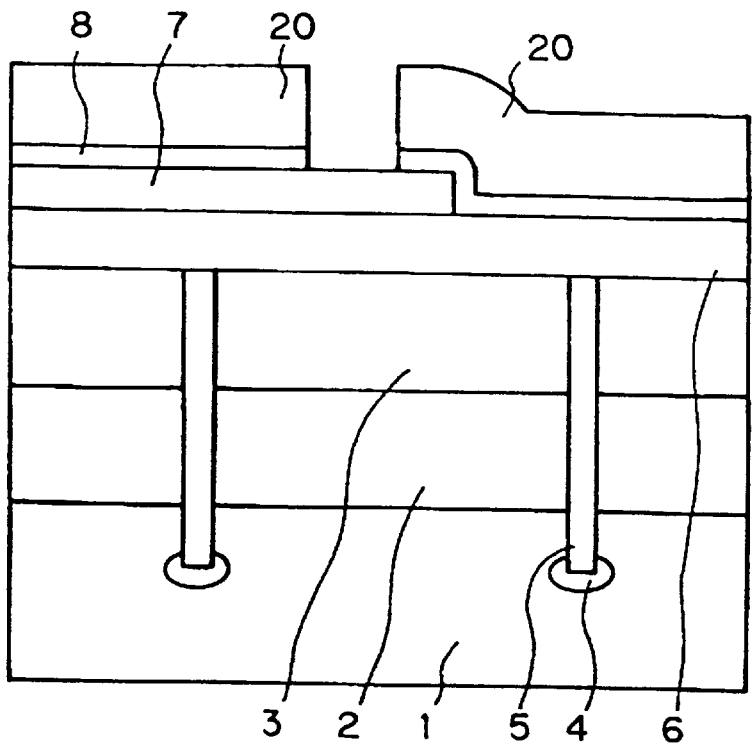

Next, an opening is formed in photoresist 20 (FIGS. 6(a) and (b)) by normal photolithography at the part where an emitter will be formed in future, and then silicon nitride film is removed by the anisotropic dry etching method.

This state is shown in FIG. 6(a) (a diffusion check transistor) and FIG. 6(b) (a transistor of a minute dimension to be processed to the product).

At this time, although the film thickness of silicon oxide film 6 (FIG. 6(a)) of the part not covered by base electrode polysilicon 7 is somewhat decreased, it does not become a problem as far as silicon collector layer $3_1$ is not exposed, and hence drawings are made irrespective of the decrease of the film thickness.

After the above process, the base electrode polysilicon is removed by dry etching and the photoresist is removed.

Figure 7:
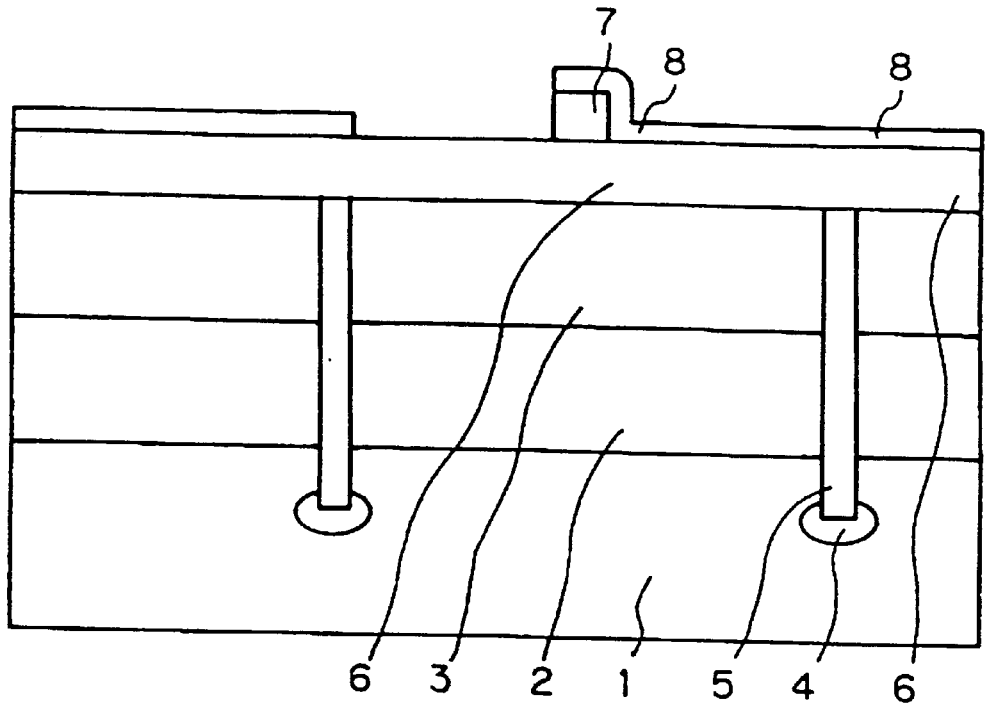
FIG. 7(a) is a longitudinal section of the diffusion check transistor shown in FIG. 3 in a process for manufacturing in which the photoresist is removed, and an unnecessary part of base electrode polysilicon 7 is removed, and 7(b) is a longitudinal section of the same having miniaturized size for use in an actual circuit.
Figure 7:
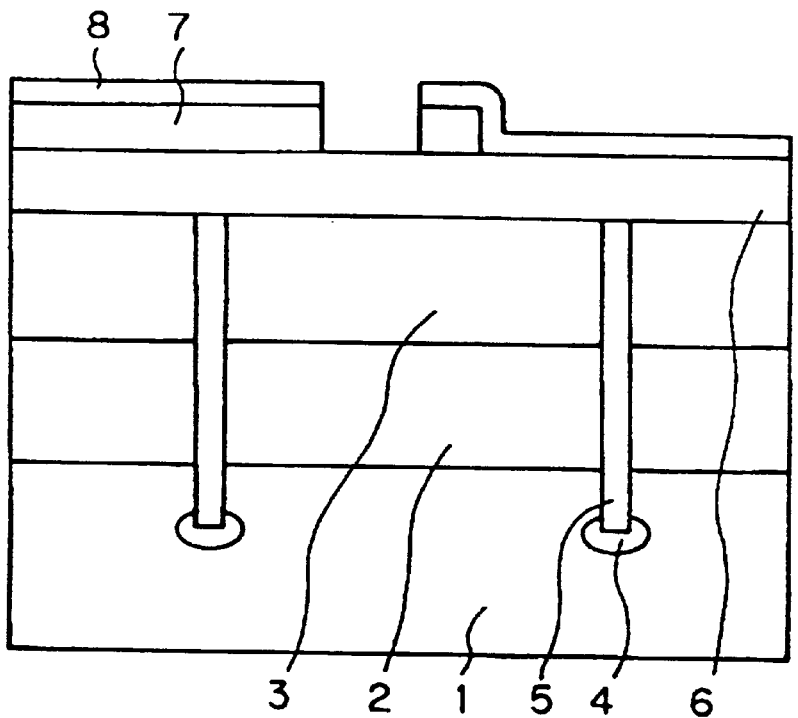

This state is illustrated in FIG. 7(a) (a diffusion check transistor) and FIG. 7(b) (a transistor with a minute dimension to be made to a product).

Further, silicon nitride film is deposited in thickness of 50 nm to 100 nm by the LPCVD method. Here, the anisotropic dry etching is again applied to silicon nitride film of the bottom part of the opening to remove it completely. As a result, the side of base electrode polysilicon 7 in the inside of the opening is covered with silicon nitride film 8.

Figure 8:
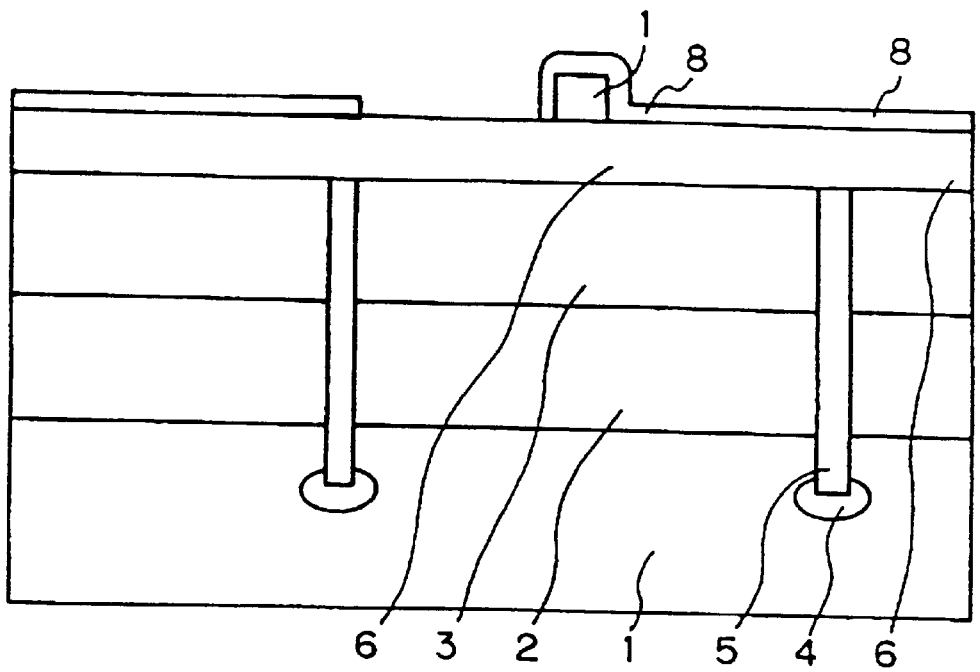
FIG. 8(a) is a longitudinal section of the diffusion check transistor in a process at the result of the process until a side covering of base electrode polysilicon 7 and silicon nitride film of the bottom of the opening are removed.
FIG. 8(b) is a longitudinal section of the same having miniaturized size for use in an actual circuit.
Figure 8:
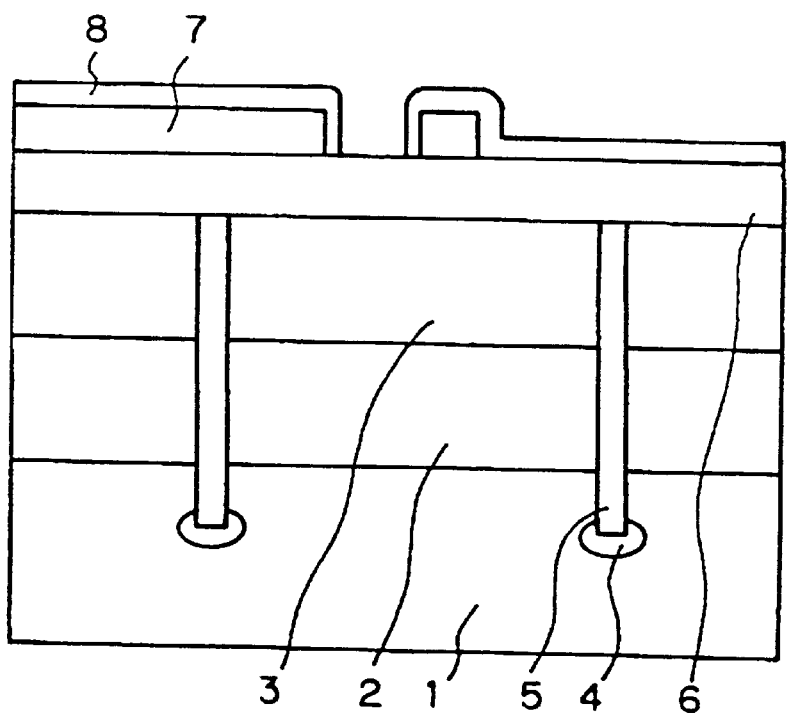

This state is illustrated in FIG. 8(a) (a diffusion check transistor) and FIG. 8(b) (a transistor with a minute dimension to be made to a product).

Then, silicon oxide film 6 in the bottom of the opening is etched by the HF base etching liquid to expose a part of silicon collector layer $3_1$ which constitutes the collector region and thus opening 101 for preparing the base is formed.

The dimension of the under surface of the base electrode polysilicon exposed through etching of silicon oxide film 6 is sufficient if the dimension is smaller than the film thickness of the base electrode polysilicon. For example, 100 nm to 250 nm is appropriate, here it is selected as 200 nm.

Figure 9:
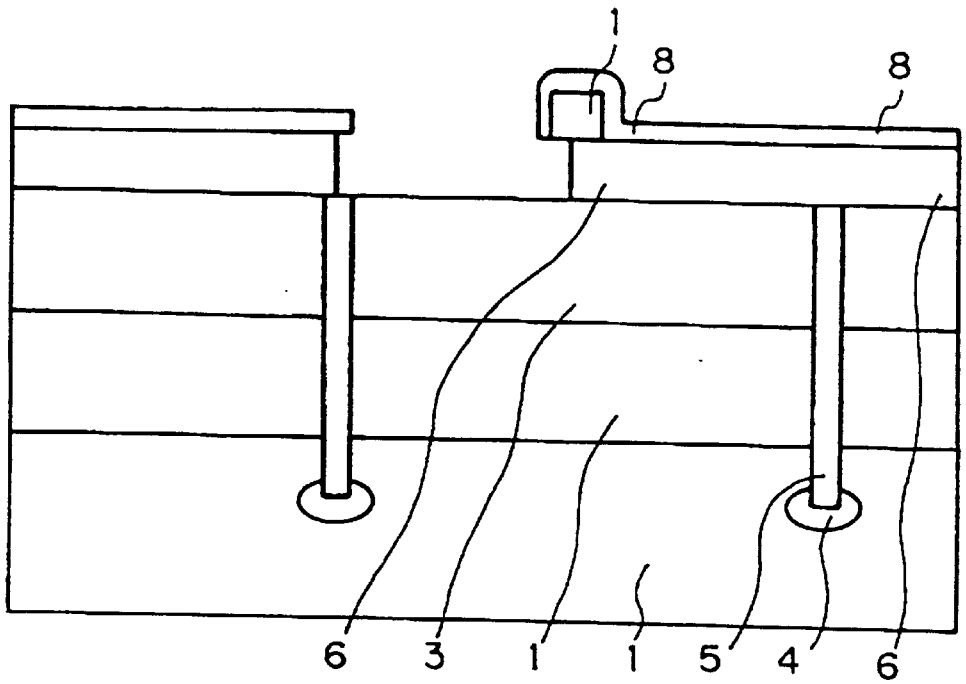
FIG. 9(a) is a longitudinal section of the diffusion check transistor in a manufacturing process in which opening 101 is completed by removing a corresponding part of the silicon oxide film, and 9(b) is a longitudinal section of the same having miniaturized size for use in an actual circuit.
Figure 9:
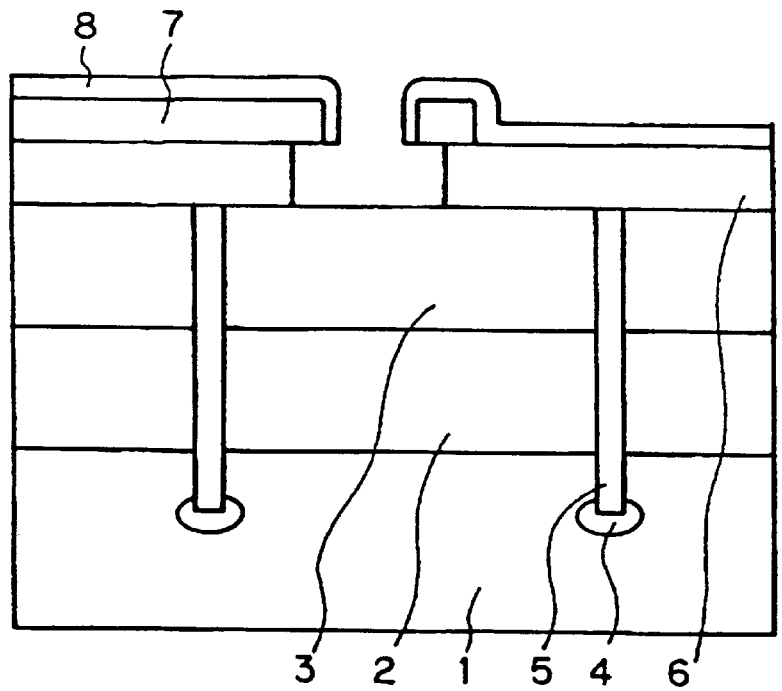

This state is illustrated in FIG. 9(a) (a diffusion check transistor) and FIG. 9(b) (a transistor with a minute dimension to be made to the product).

At this time, with the transistor for diffusion check, as can be seen in FIG. 9(a), opening 101 is formed such that one side of which is positioned on trench 5.

Subsequently, an intrinsic base is formed by a selective epitaxial growth method in the same way as in the conventional technique. From viewpoint of growth, methods such as the LPCVD method or the gas source MBE method are applicable, but here a UHV/CVD method will be employed for description by way of an example.

An example of the processing condition is $Si_2H_6$ flow rate 3 sccm, temperature 605° C.

Figure 10:
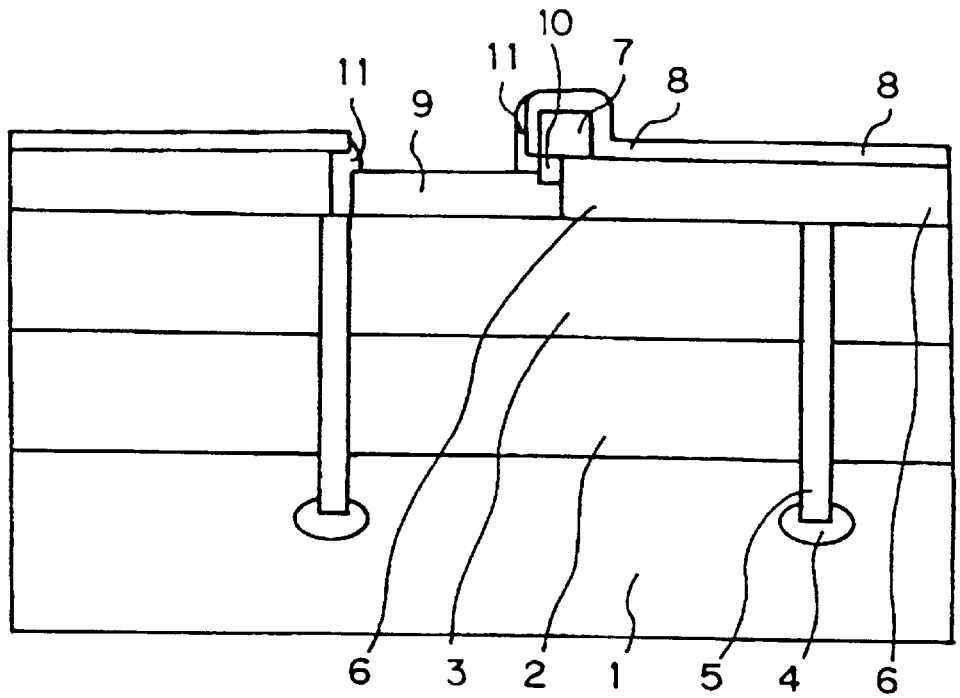
FIG. 10(a) is a longitudinal section of the diffusion check transistor in a process for manufacturing showing the result of completion of base electrode polysilicon 7 and polysilicon 10, and formation of a side wall of silicon oxide film 11, and 10(b) is a longitudinal section of the same having miniaturized size for use in an actual circuit.
Figure 10:
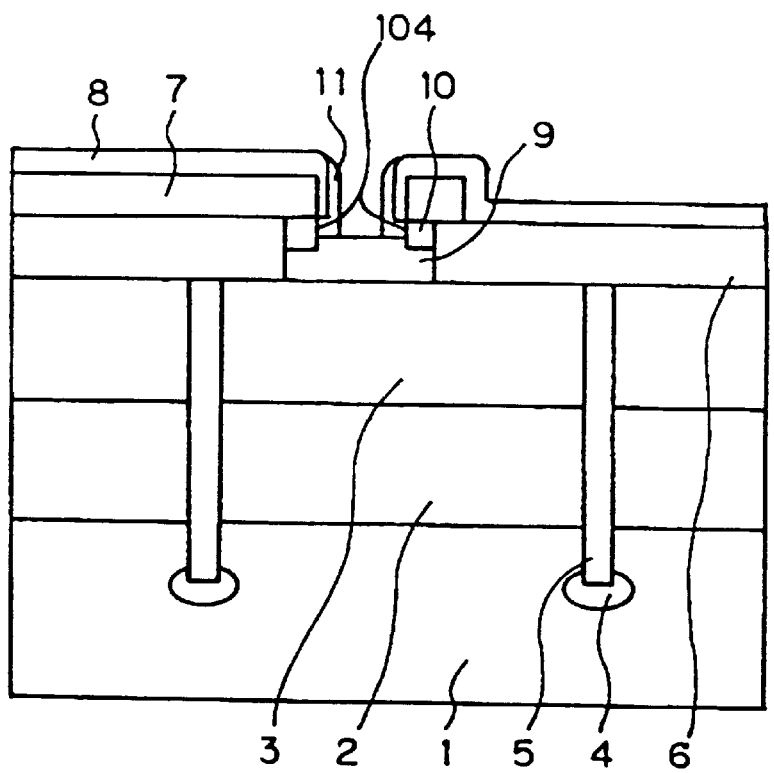

At this time, P type single crystal silicon base region 9 is formed on the exposed portion of silicon collector $3_1$, as shown in FIG. 10. At the same time, P type polysilicon layer 10 is formed from the under surface of the pushed out part of base electrode polysilicon 7 toward silicon collector layer $3_1$ which constitutes the collector region. This base region 9 and polysilicon layer 10 continue their growth until they contact each other, and the transistor to be made to the product becomes to show opening 104.

Subsequently, deposition of the silicon oxide film by LPCVD and anisotropic dry etching are performed to form a side wall of silicon oxide film 11, thereby reaching a state with which opening 101 is shown in a diffusion transistor and opening 102 is shown in a product. This state is illustrated in FIG. 10(a) (a diffusion check transistor) and FIG. 10(b) (a transistor with a minute dimension to be made to the product).

Following which, collector probe opening 201 and emitter probe opening 301 are formed by photolithography and dry etching. At this time, it must be arranged that emitter opening 101 and emitter probe opening 301 at least overlap on trench 5. The reason is that a trench in emitter opening 101 and a trench in emitter probe opening 301, both trenches for receiving $N^+$ type polysilicon which are to be buried therein in the later process, are required to be connected with each other. In this case, insulation buried in the trench somewhat sinks at the overlapped position.

Figure 11:
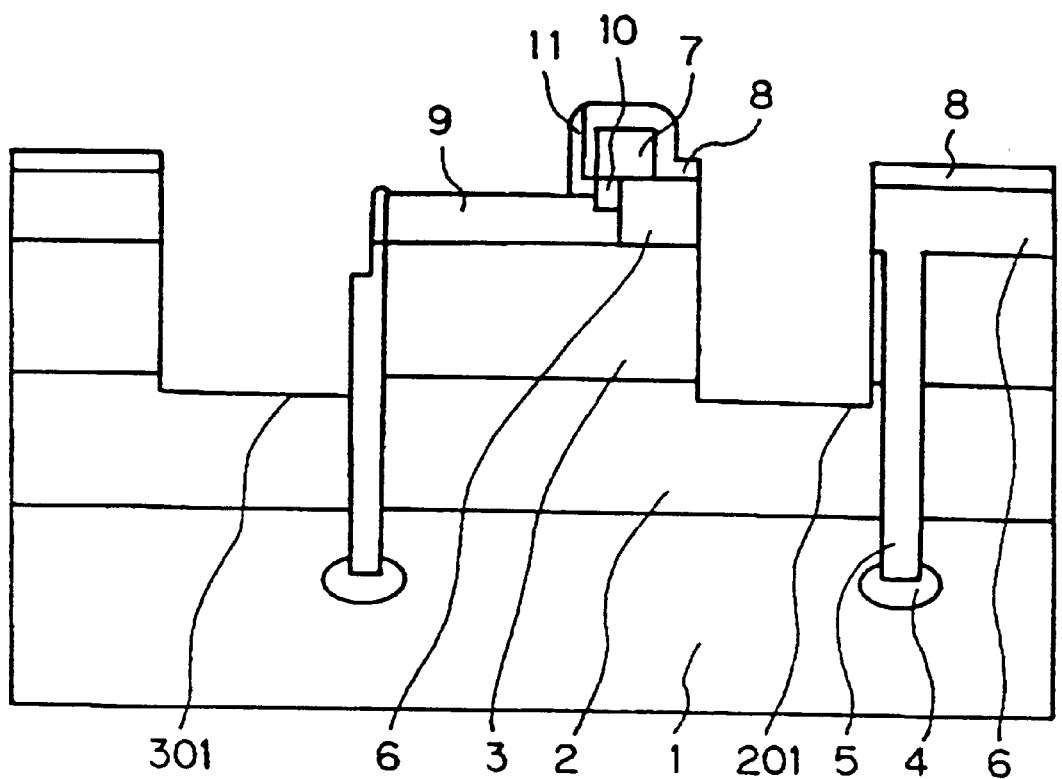
FIG. 11(a) is a longitudinal section of the diffusion check transistor shown in FIG. 1 in a process for manufacturing openings 201 and 301.
FIG. 11(b) is a plan thereof.
Figure 11:
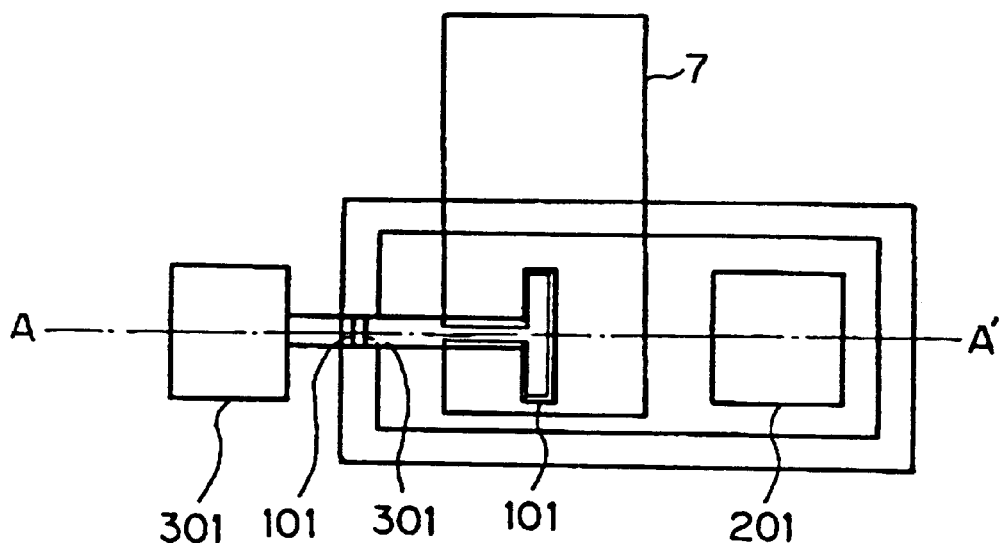
Figure 12:
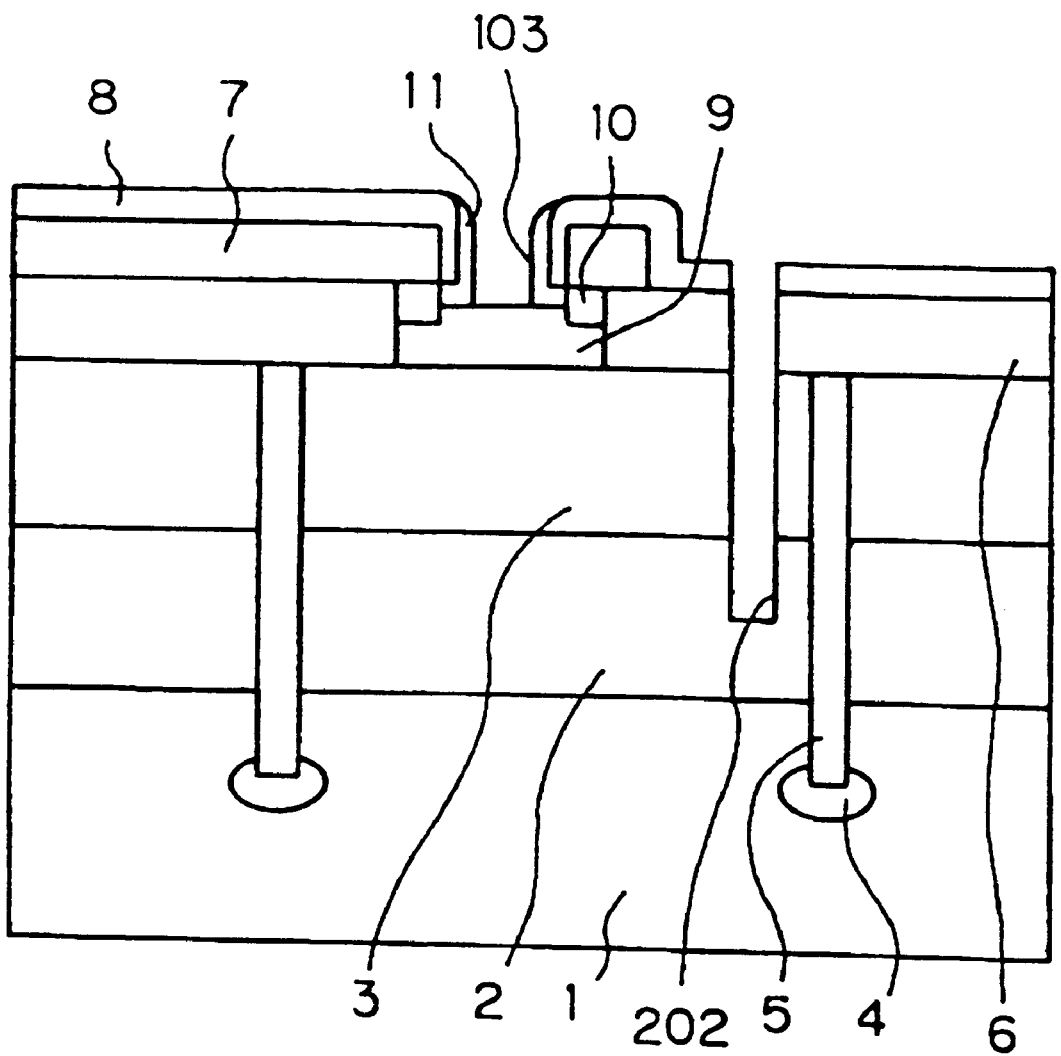
FIG. 12 is a longitudinal section of the first embodiment shown in FIG. 3 in the primary process for manufacturing opening 202 in the product.

This state is illustrated in FIG. 11(a) (sectional view of the diffusion check transistor), FIG. 11(b) (plan of the transistor with a minute dimension to be made to a product) and FIG. 12 (sectional view of the transistor to be used in a circuit).

Further, polysilicon 12 added with N type impurities (for example, phosphorus or arsenic) is deposited by the LPCVD method. Here, phosphorus about 5E20cm−3 is added. The thickness of polysilicon is appropriate when it is in a range of 1.5 times to two times the dimension of emitter opening 101, that is, 600 nm to 1000 nm. Here, it is determined as 8000 nm.

Figure 13:
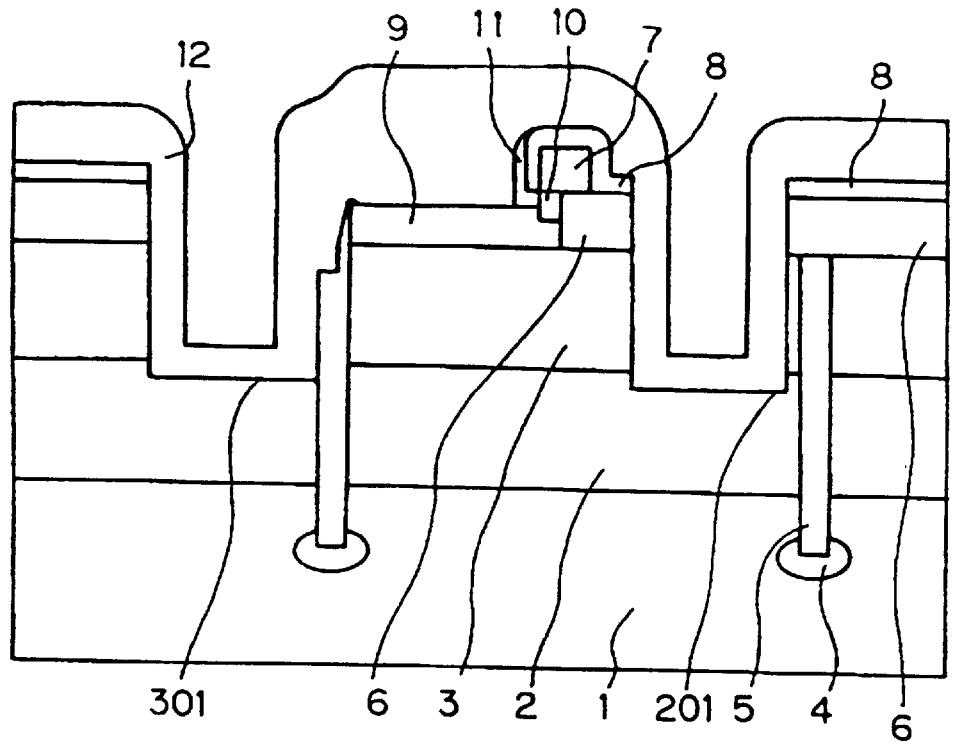
FIG. 13(a) is a longitudinal section of the diffusion check transistor shown in FIG. 3 in a process showing the result of deposition of the N$^+$ type polysilicon 12 and FIG. 13(b) is a longitudinal section of the same having miniaturized size for use in an actual circuit.
Figure 13:
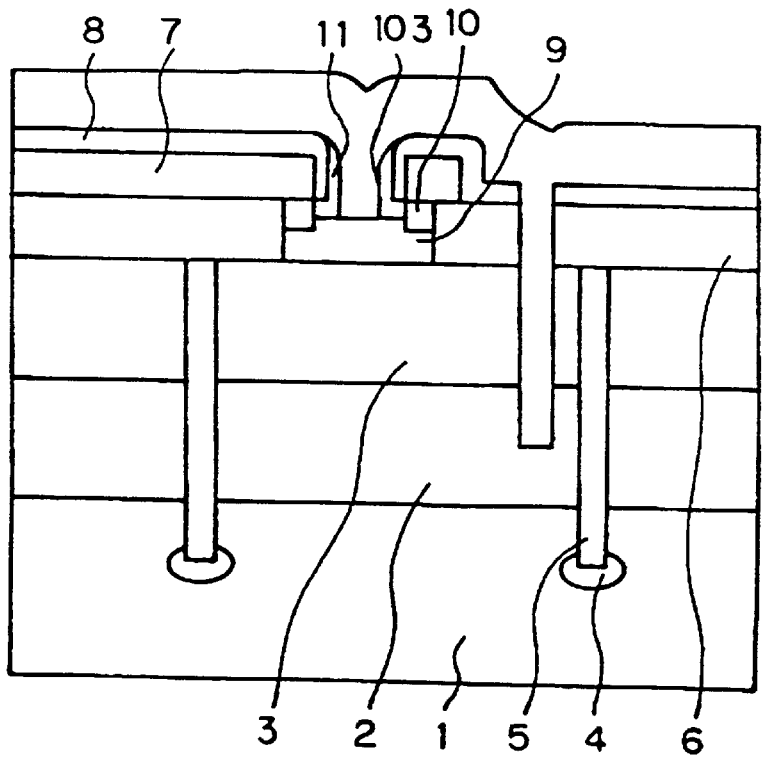

This state is illustrated in FIG. 13(a) (a diffusion check transistor) and FIG. 13(b) (a transistor of a minute dimension to be made to the product).

Next, etching back of polysilicon is performed, and further base probe opening 401 is formed by the photolithographic process and the dry etching process to expose base electrode polysilicon.

Then, through the heat-treatment for emitter push-in, N type emitter region 13 is formed with single crystal silicon in base region 9 enclosed by side walls of silicon oxide film 11.

In this way, the diffusion check transistor of the first embodiment shown in FIGS. 3(a), (b) is formed.

All probe openings 201, 301, 401 of the transistor shown in FIG. 3(a) have large sizes which allow direct probing, and emitter region 13 has a minute dimension such as 1 μm or less, for example, 0.2 to 0.6 μm, realizing the same dimension as that in the circuit. Therefore at this stage, the emitter forming condition is directly measured and when the emitter push-in is insufficient, additional emitter push-in is applied.

The surface of the transistor (FIG. 4(a)) is successively covered with the insulation film (for example, silicon oxide film), and on the transistor to be made to the product, contact holes which reach emitter, base and collector electrode polysilicon are formed, then after spattering aluminum base alloy, photolithography and anisotropic dry etching is applied to produce an emitter electrode, a base electrode and a collector electrode which are all of an aluminum base.

Here, improvements of the characteristics promoted by the present invention compared to the conventional technique are described. With a series of processes of the present invention, it has become possible to produce the transistor without employing the photolithographic process in processing the emitter electrode polysilicon, and further it has become possible to confirm the characteristic of the transistor on the way of the diffusion process, specifically the transistor having the emitter of the same size as the emitter of the transistor to be actually used in the circuit.

A second embodiment of the present invention will be described with reference to the drawings.

Figure 14:
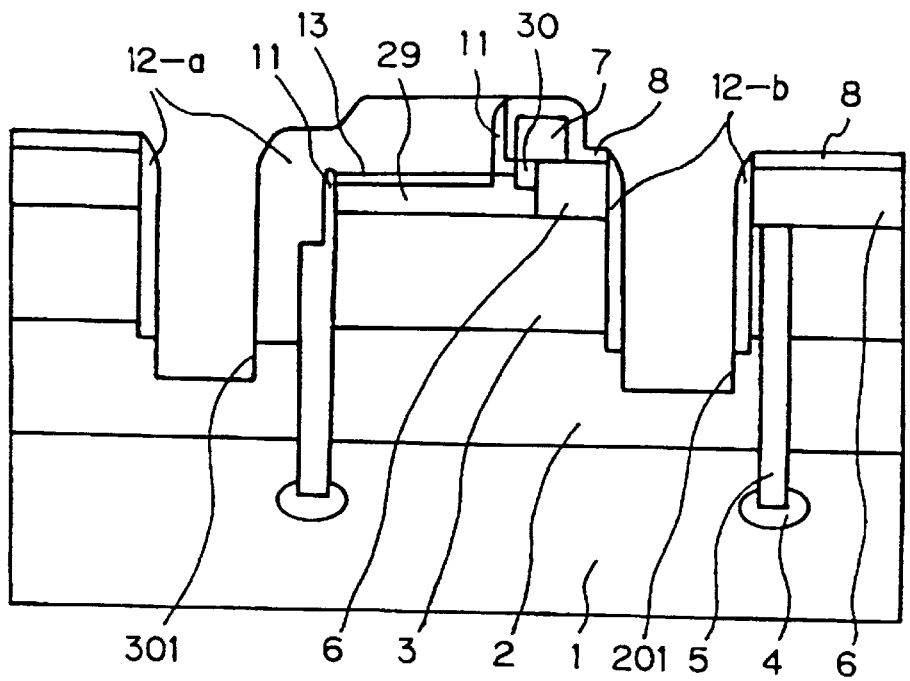
FIG. 14 shows a sectional view of a second embodiment of the diffusion check transistor to be used in the manufacturing method of the semiconductor device of the present invention.

FIG. 14 shows a longitudinal section of a diffusion check transistor of use for measuring according to the second embodiments of the present invention.

Basically, it is the same as the first embodiment and differs only in a base portion.

In other words, it is a layered film composed of a base produced by the selective epitaxial growth and a silicon layer for forming an emitter by future diffusion, the base being P type SiGe alloy (for example, the whole alloy comprises uniform Ge density of 10%; and in order from the bottom: 100 angstrom layer, no boron added; boron addition region: 400 angstrom layer, boron 7E18 cm$^{-3}$), the silicon layer being of a structure, for example, 200 angstrom, no boron added. This layered film is intrinsic base layer 29. Of course, addition of Ge, boron to multicrystal layer 30 concurrently formed is varied according to the constitution of this layered film.

Although the second embodiment has an advantage that it is easy to increase current amplification factor hFE, at the same time it is susceptible to the influence of a leak current from the collector-base junction which may be caused by lattice inconformity, and hence, it is important to perform monitoring during the diffusion process as in the present invention.

Figure 15:
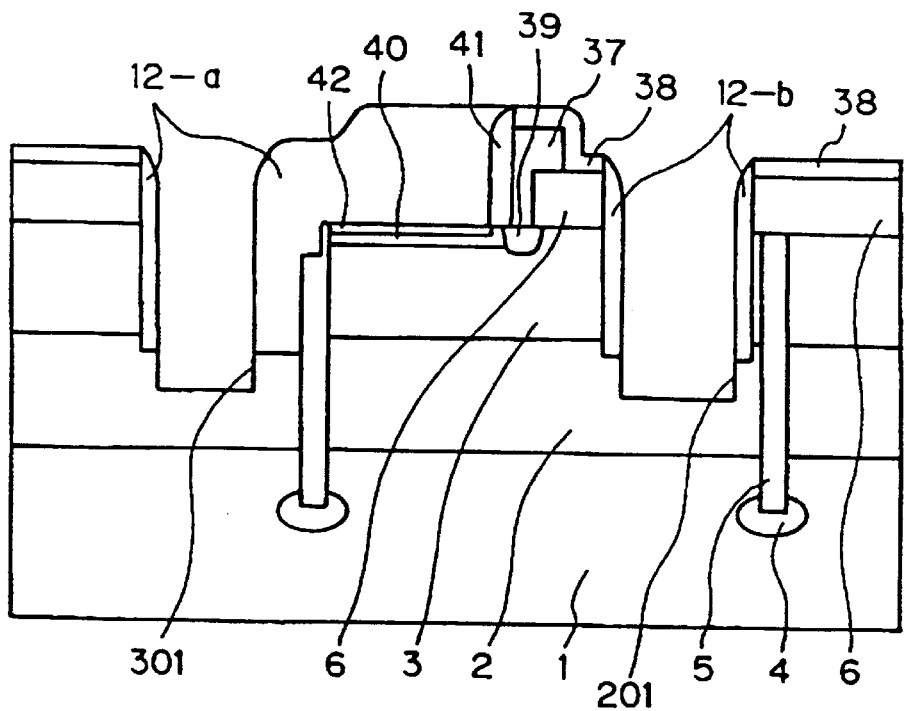
FIG. 15 shows a sectional view of a third embodiment of the diffusion check transistor to be used in the manufacturing method of the semiconductor device of the present invention.

Next, a third embodiment will be shown in FIG. 15.

In the present embodiment, the intrinsic base is formed by the diffusion method. In other words, base electrode polysilicon 37 is covered with insulation film (for example, silicon nitride film) 38. Graft base 39 is formed by boron diffused from base electrode polysilicon 37 which contacts silicon collector 3. Intrinsic base 40 is formed by the ion implantation method. Emitter region 42 is formed by diffusion of N type impurities from emitter electrode polysilicon 12 on the intrinsic base within the region enclosed by insulation film (for example, silicon oxide film) 41.

Advantages of the present embodiment will be described below. In the first and the second embodiments, parts of the sides of intrinsic base 9 and 29 positioned above trench 5 are covered with insulation film (for example, silicon oxide film) 11. However, if the covering is insufficient, emitter electrode polysilicon 12 contacts the sides of the intrinsic bases, resulting in diffusion of N type impurities generated from the side of the intrinsic bases. Consequently, an emitter region formed on the sides is caused to contact the silicon collector with a risk of the transistor malfunction. On the contrary, in the present embodiment, since ingredients of the base and the emitter are diffused into silicon collector 3 in order, there is no risk of a short circuit being generated between the emitter region and the silicon collector.

Figure 16:
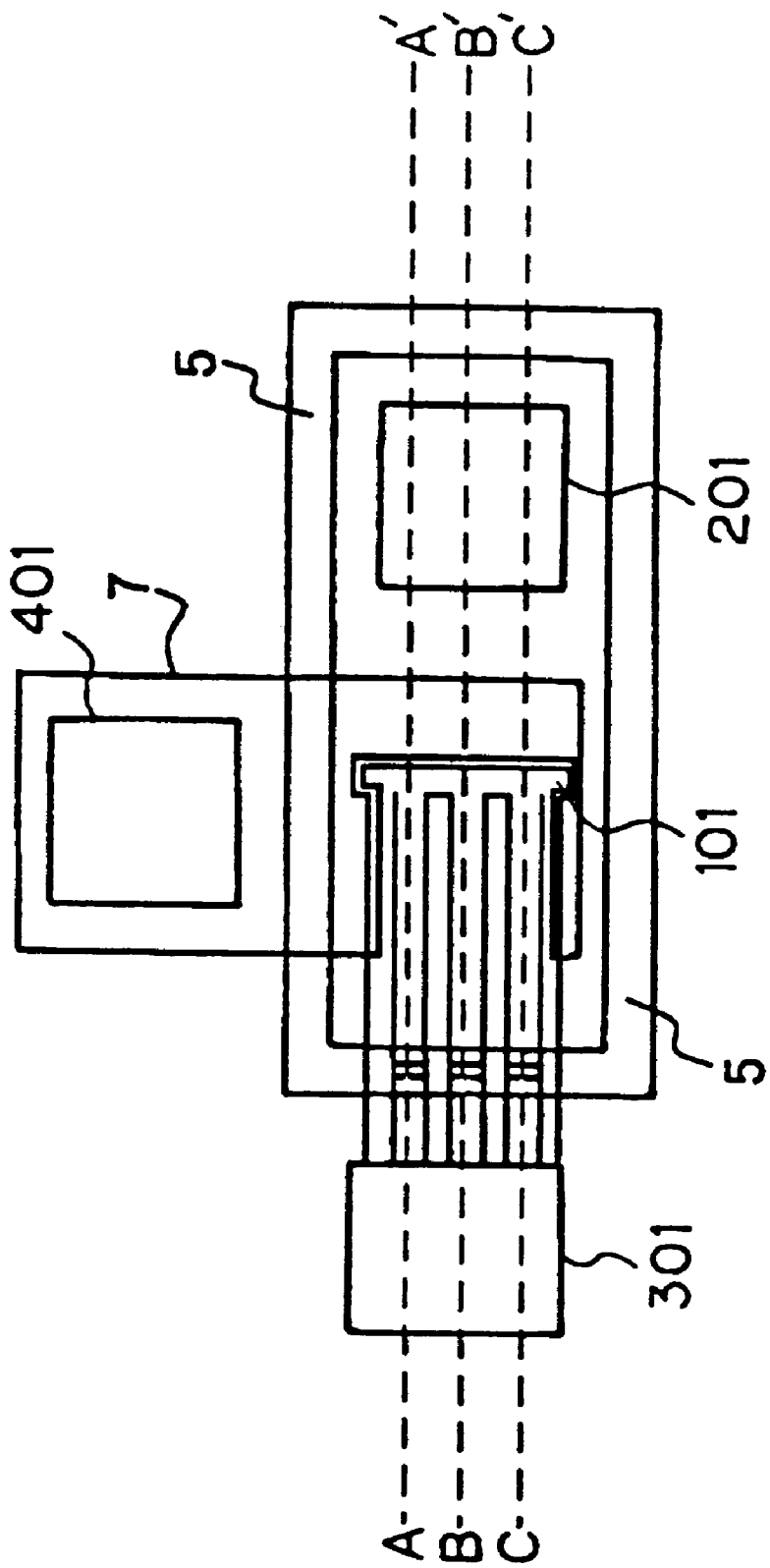
FIG. 16 shows a plan view of a fourth embodiment of the diffusion check transistor to be used in the manufacturing method of the semiconductor device of the present invention.

A fourth embodiment of the present invention will be described with reference to FIG. 16.

In the present embodiment, emitter opening 101 and emitter probe opening 301 are connected by means of two or more trenches. Since the resistance is decreased because of the increased junctions between the two openings, the influence of the voltage drop can be removed to bring the merit for the present embodiment.

As described above, according to the present invention, it has become possible to produce the transistor without employing photolithographic process in processing the emitter electrode polysilicon, and further it has become possible to confirm the characteristic of the transistor during the diffusion process, the transistor having the emitter of the same size as the emitter of the transistor to be actually used in the circuit.

What is claimed is:

1. A method of manufacturing a semiconductor device, comprising:

forming a diffusion check transistor for measuring during a manufacturing process;

measuring characteristics of the diffusion check transistor at a predetermined stage of manufacturing;

adjusting a depth of an emitter according to the result of the measuring, wherein said step of forming a diffusion check transistor comprises:

forming a buried layer of a first conductive type on a substrate of a second conductive type;

forming a first single crystal region on said buried layer;

forming a device separation trench which extends from a surface of the first single crystal region into the substrate and a channel stopper made of insulation at the substrate side tip of said device separation trench;

filling insulator in said device separation trench and flattening a surface of the filled insulator;

forming an insulator film on said first single crystal region;

forming a base electrode on said insulator film;

insulating a surface of said base electrode with a second insulator film;

removing a portion of said insulator film near said base electrode to provide an exposed portion on said first single crystal region;

forming an intrinsic base with a second conductive type single crystal region on said first single crystal region on the exposed portion of said first single crystal region;

forming a first probing opening which is adjoining to the first single crystal region and extends from said second insulator film to an inside of said buried layer, and a second opening formed through a thickness of said first single crystal region to split off an adjacent single crystal region, wherein said second opening allows a probing needle to contact at the adjacent single crystal region, which is used as a collector;

forming first crystal silicon walls of the first conductive type, respectively, on inner walls of the first opening and the second opening overlapping said device separation trench and emitter region.

2. A method of manufacturing a semiconductor device according to claim 1, wherein said step of forming the diffusion check transistor further includes forming a third opening for probing the base of said diffusion check transistor in the single crystal region, and coating inner walls of said third opening with the first crystal silicon of the first conductive type.

3. A method of manufacturing a semiconductor device according to claim 2, wherein said step of forming the intrinsic base uses a multilayered film composed of SiGe alloy and Si.

4. A method of manufacturing a semiconductor device according to claim 2, wherein as to said first, second, and third opening, the forming of the inner walls from the first crystal silicon of the first conductive type are executed concurrently.

5. A method of manufacturing a semiconductor device according to claim 1, wherein said step of forming the intrinsic base uses a multilayered film composed of SiGe alloy and Si.

* * * * *